United States Patent
Gunnam et al.

(10) Patent No.: US 8,683,299 B2
(45) Date of Patent: Mar. 25, 2014

(54) ADJUSTING INPUT SAMPLES IN TURBO EQUALIZATION SCHEMES TO BREAK TRAPPING SETS

(75) Inventors: Kiran Gunnam, San Jose, CA (US); Shaohua Yang, San Jose, CA (US); Changyou Xu, Fremont, CA (US)

(73) Assignee: LSI Corporation, San Jose, CA (US)

( * ) Notice: Subject to any disclaimer, the term of this patent is extended or adjusted under 35 U.S.C. 154(b) by 1080 days.

(21) Appl. No.: 12/540,035

(22) Filed: Aug. 12, 2009

(65) Prior Publication Data
US 2010/0042905 A1   Feb. 18, 2010

Related U.S. Application Data

(60) Provisional application No. 61/089,297, filed on Aug. 15, 2008.

(51) Int. Cl.
*G06F 11/10*   (2006.01)

(52) U.S. Cl.
USPC ............................................. 714/774

(58) Field of Classification Search
USPC ............................................. 714/774
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 5,721,745 A | 2/1998 | Hladik et al. |
| 5,734,962 A | 3/1998 | Hladik et al. |
| 6,023,783 A | 2/2000 | Divsalar et al. |

(Continued)

FOREIGN PATENT DOCUMENTS

| | | |
|---|---|---|
| CN | 101174838 A | 5/2008 |
| CN | 101174839 A | 5/2008 |

(Continued)

OTHER PUBLICATIONS

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

(Continued)

*Primary Examiner* — Scott Baderman
*Assistant Examiner* — Jigar Patel
(74) *Attorney, Agent, or Firm* — Mendelsohn, Drucker & Dunleavy, P.C.; Craig M. Brown; Steve Mendelsohn

(57) ABSTRACT

In one embodiment, a turbo equalizer has a channel detector that receives equalized samples and generates channel soft-output values. An LDPC decoder attempts to decode the channel soft-output values to recover an LDPC-encoded codeword. If the decoder converges on a trapping set, then an adjustment block selects one or more of the equalized samples based on one or more specified conditions and adjusts the selected equalized samples. Selection may be performed by identifying the locations of unsatisfied check nodes of the last local decoder iteration and selecting the equalized samples that correspond to bit nodes of the LDPC-encoded codeword that are connected to the unsatisfied check nodes. Adjustment of the equalized samples may be performed using any combination of scaling, offsetting, and saturation. Channel detection is then performed using the adjusted equalized samples to generate an updated set of channel soft-output values, which are subsequently decoded by the decoder.

24 Claims, 5 Drawing Sheets

(56) References Cited

U.S. PATENT DOCUMENTS

| | | | |
|---|---|---|---|
| 6,236,686 B1* | 5/2001 | Kamishima | 375/295 |
| 6,307,901 B1 | 10/2001 | Yu et al. | |
| 6,550,023 B1 | 4/2003 | Brauch et al. | |
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |
| 7,143,333 B2 | 11/2006 | Blankenship et al. | |
| 7,181,676 B2 | 2/2007 | Hocevar | |
| 7,219,288 B2 | 5/2007 | Dielissen et al. | |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,373,581 B2 | 5/2008 | Okamura et al. | |
| 7,457,367 B2 | 11/2008 | Farhang-Boroujeny et al. | |
| 7,689,888 B2 | 3/2010 | Kan et al. | |
| 7,725,800 B2 | 5/2010 | Yang et al. | |
| 7,730,377 B2 | 6/2010 | Hocevar | |
| 7,739,558 B1 | 6/2010 | Farjadrad et al. | |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wehn et al. | |
| 8,020,070 B2 | 9/2011 | Langner et al. | |
| 8,037,394 B2 | 10/2011 | Djurdjevic et al. | |
| 8,046,658 B2 | 10/2011 | Heinrich et al. | |
| 8,051,363 B1 | 11/2011 | Liu | |
| 8,103,931 B2 | 1/2012 | Wang et al. | |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,161,345 B2 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 | 7/2012 | Sheng et al. | |
| 8,219,878 B1 | 7/2012 | Varnica et al. | |
| 8,255,763 B1 | 8/2012 | Yang et al. | |
| 8,301,984 B1* | 10/2012 | Zhang et al. | 714/780 |
| 2002/0062468 A1 | 5/2002 | Nagase et al. | |
| 2002/0166095 A1* | 11/2002 | Lavi et al. | 714/786 |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0204264 A1 | 9/2005 | Yusa | |
| 2005/0283707 A1 | 12/2005 | Sharon et al. | |
| 2006/0013306 A1 | 1/2006 | Kim et al. | |
| 2006/0036928 A1* | 2/2006 | Eroz et al. | 714/758 |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1* | 10/2007 | Richardson et al. | 714/758 |
| 2007/0234184 A1* | 10/2007 | Richardson | 714/780 |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastras-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0063931 A1 | 3/2009 | Rovini et al. | |
| 2009/0083609 A1 | 3/2009 | Yue et al. | |
| 2009/0132897 A1* | 5/2009 | Xu et al. | 714/796 |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1 | 4/2010 | Sharon et al. | |
| 2011/0041029 A1 | 2/2011 | Yedidia et al. | |
| 2012/0135285 A1 | 5/2012 | Iwama et al. | |
| 2012/0139074 A1 | 6/2012 | Abe | |

FOREIGN PATENT DOCUMENTS

| | | | |
|---|---|---|---|
| EP | 1926142 A1 | 5/2008 | |
| JP | 2001251384 A | 9/2001 | |
| JP | 2004005854 A | 1/2004 | |
| JP | 2005020505 A | 1/2005 | |
| JP | 2005500513 A | 1/2005 | |
| JP | 2007306495 A | 11/2007 | |
| JP | 2008112516 A | 5/2008 | |
| JP | 2009100222 A | 5/2009 | |
| WO | WO03092170 A1 | 11/2003 | |
| WO | WO2004079563 A1 | 9/2004 | |
| WO | WO2007114724 A1 | 10/2007 | |
| WO | WO2008004215 A2 | 1/2008 | |
| WO | WO 2010/019168 A1 | 2/2010 | |

OTHER PUBLICATIONS

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block- LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001, pp. 638-656, vol. 47, No. 2.

Tom Richardson—"Error Floors of LDPC Codes", IEEE Transactions on Information Theory, Feb. 2001, pp. 1426-1435, vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

(56) References Cited

OTHER PUBLICATIONS

Yang Han and William E. Ryan—"LDPC Decoder Strategies for Achieving Low Error Floors", Proceedings of Information Theory and Applications Workshop, San Diego, CA, Jan. 2008, pp. 1-10.
Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.
Dale E. Hocevar—"A Reduced Complexity Decoder Architecture Via Layered Decoding of LDPC Codes", IEEE Workshop on Signal Processing Systems, 2004, pp. 107-112.
Robert G. Gallager—"Low Density Parity—Check Codes",Cambridge Mass Jul. 1963, p. 90.
T. Richardson and R. Urbanke—"Modern Coding Theory", Cambridge University Press, Preliminary version—Oct. 18, 2007, p. 590.
Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.
Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.
D.J.C. Mackay and R.M. Neal—"Near Shannon limit performance of low density parity check codes", Electronics Letters Mar. 13, 1997, pp. 458-459, vol. 33 No. 6.
Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299, vol. 53, No. 8.
Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.
Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002. pp. 404-412, vol. 37, No. 3.
Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.
Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.
R.Michael Tanner—"A Recursive Approach to Low Complexity Codes",IEEE transaction on Information Theory, Sep. 1981, pp. 533-547, vol. IT-27, No. 5.
Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.
Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.
Yang Han, William E. Ryan—"Low-Floor Decoders for LDPC Codes", IEEE Transactions on Communications, vol. 57, No. 6, Jun. 2009, pp. 1663-1673.
PCT International Search Report dated Feb. 9, 2009 from International Application No. PCT/US 08/86537.
PCT International Search Report dated May 15, 2009 from International Application No. PCT/US 09/39279.
PCT International Search Report dated Feb. 12, 2009 from International Application No. PCT/US 08/86523.
PCT International Search Report dated May 28, 2009 from International Application No. PCT/US 09/41215.
PCT International Search Report dated May 15, 2009 from International Application No. PCT/US 09/39918.
Vila Casado, Andres I., Weng, Wen-Yen and Wesel, Richard D. "Multiple Rate Low-Density Parity-Check Codes with Constant Blocklength," IEEE 2004, pp. 2010-2014.
Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).
Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.
K. Gunnam et al., "Value-Reuse Properties of Min-Sum for Gf(q)" (dated Oct. 2006) Dept. of ECE, Texas A&M University Technical Note, published about Aug. 2010.
K. Gunnam et al., "Value-Reuse Properties of Min-Sum for GF (q)" (dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.
Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.
Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.
Cavus, Enver et al., "An IS Simulation Technique for Very Low BER Performance Evaluation of LDPC Codes," IEEE International Conference on Communications, Jun. 1, 2006, pp. 1095-1100.
Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.
Richardson, Tom, "Error Floors of LDPC Codes," Allerton Conf. on Communication, Control and Computing, (Monticello, Illinois), Oct. 2003, pp. 1426-1435.
Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.
Sripimanwat, K., "Turbo Code Applications: A Journey From a Paper to Realization", Oct. 26, 2005, Springer, p. 27.
Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.
Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.
Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.
C. A. Cole, S. G. Wilson, E. K. Hall and T. R. Giallorenzi, "A General Method for Finding Low Error Rates of LDPC Codes," http://arxiv.org/abs/cs.IT/0605051.
D. MacKay and M. Postol, "Weaknesses of margulis and ramanujan-margulis low- density parity-check codes," Electronic Notes in Theoretical Computer Science, vol. 74, 2003.

(56) References Cited

OTHER PUBLICATIONS

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Computers, Oct. 28, 2005-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

Koetter, R., et al. "Turbo equalization," Signal Processing Magazine, IEEE, vol. 21, No. 1, pp. 67-80, Jan. 2004.

Cavus, F, et al., "Low BER performance estimation of LDPC codes via application of importance sampling to trapping sets," IEEE Transactions on Communications, vol. 57, No. 7, pp. 1886-1888, Jul. 2009.

Ryan, W. E., et al., "Channel Codes: Classical and Modern," Cambridge University Press, 2009, 710 pages.

Matsuoka, K., et al., "Improvement of Turbo Equalization with LDPC Code," IEICE Transaction, Apr. 1, 2007, vol. J90-B, No. 4, pp. 432-436 with partial English translation.

Lee, M.K., et al., "Adaptive Turbo Equalizer with Stopping Rule Based on LDPC Codes," ISIT, 2009, pp. 928-932.

Kang, J., et al., "A Two-Stage Iterative Decoding of LDPC Codes for Lowering Error Floors," IEEE Global Telecommunications Conference, 2008, pp. 1-4.

Sharon, E, et al., "An Efficient Message-Passing Schedule for LDPC Decoding," 2004, XP002713218, Retrieved from http://www.eng.biu.ac.il/goldbej/papers/engisreal.pdf on Sep. 19, 2013, 4 pages.

Chen, J., et al., "Density Evolution for Two Improved BP-Based Decoding Algorithms of LDPC Codes," Communications Letters, IEEE, May 2002, vol. 6, No. 5, pp. 208-210.

Chen, J., et al., "Near Optimum Universal Belief Propagation Based Decoding of Low-Density Parity Check Codes," IEEE Transactions on Communications Letters, Mar. 2002, vol. 50, No. 3, pp. 406-414.

\* cited by examiner

ADJUSTING INPUT SAMPLES IN TURBO EQUALIZATION SCHEMES TO BREAK TRAPPING SETS

CROSS-REFERENCE TO RELATED APPLICATIONS

This application claims the benefit of the filing date of U.S. provisional application No. 61/089,297, filed on Aug. 15, 2008, the teachings of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, PCT patent application no. PCT/US08/86537 filed Dec. 12, 2008, PCT patent application no. PCT/US09/39918 filed Apr. 8, 2009, PCT application no. PCT/US09/39279 filed on Apr. 2, 2009, U.S. patent application Ser. No. 12/420,535 filed Apr. 8, 2009, U.S. patent application Ser. No. 12/475,786 filed Jun. 1, 2009, U.S. patent application Ser. No. 12/260,608 filed on Oct. 29, 2008, PCT patent application no. PCT/US09/41215 filed on Apr. 21, 2009, U.S. patent application Ser. No. 12/427,786 filed on Apr. 22, 2009, U.S. patent application Ser. No. 12/492,328 filed on Jun. 26, 2009, U.S. patent application Ser. No. 12/492,346 filed on Jun. 26, 2009, U.S. patent application Ser. No. 12/492,357 filed on Jun. 26, 2009, U.S. patent application Ser. No. 12/492,374 filed on Jun. 26, 2009, and U.S. patent application Ser. No. 12/538,915 filed on Aug. 11, 2009, the teachings of all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In attempting to recover an error-correction-encoded codeword, an error-correction decoder may encounter one or more trapping sets that prevent the decoder from properly decoding the codeword. Trapping sets, which represent subgraphs in a Tanner graph of an error-correction code, typically have a strong influence on error-floor characteristics of the error-correction code because a trapping set may force the decoder to converge to an incorrect result. To improve error-floor characteristics, a turbo equalizer, in which the error-correction decoder resides, may employ different techniques to, for example, (i) break the trapping sets and/or (ii) prevent the error-correction decoder from converging on trapping sets.

SUMMARY OF THE INVENTION

In one embodiment, the present invention is an apparatus for recovering an error-correction (EC)-encoded codeword from a set of input samples. The apparatus comprises an EC decoder, an adjuster, and a channel detector. The EC decoder performs EC decoding to attempt to recover the EC-encoded codeword and generates a first set of soft-output values, where each soft-output value corresponding to a bit of the EC-encoded codeword. The adjuster adjusts, if the EC decoder converges on a trapping set, one or more of the input samples to generate an adjusted set of input samples, and the apparatus determines whether one or more specified conditions exist to select the one or more input samples for adjustment. The channel detector performs channel detection to generate a second set of soft-output values for subsequent EC decoding, where each soft-output value in the second set corresponds to a bit of the EC-encoded codeword. The second set of soft-output values is generated based on (i) the adjusted set of input samples and (ii) the first set of soft-output values.

In another embodiment, the present invention is a method for recovering an error-correction (EC)-encoded codeword from a set of input samples. In particular, EC decoding is performed to attempt to recover the EC-encoded codeword, and a first set of soft-output values (e.g., Extn) is generated where, each soft-output value corresponds to a bit of the EC-encoded codeword. If the EC decoding converges on a trapping set, then a determination is made as to whether one or more specified conditions exist to select one or more of the input samples for adjustment. The one or more input samples selected are adjusted to generate an adjusted set of input samples. Channel detection (e.g., DH) is then performed to generate a second set of soft-output values for subsequent EC decoding, where each soft-output value in the second set corresponds to a bit of the EC-encoded codeword. The second set of soft-output values is generated based on (i) the adjusted set of input samples and (ii) the first set of soft-output values.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
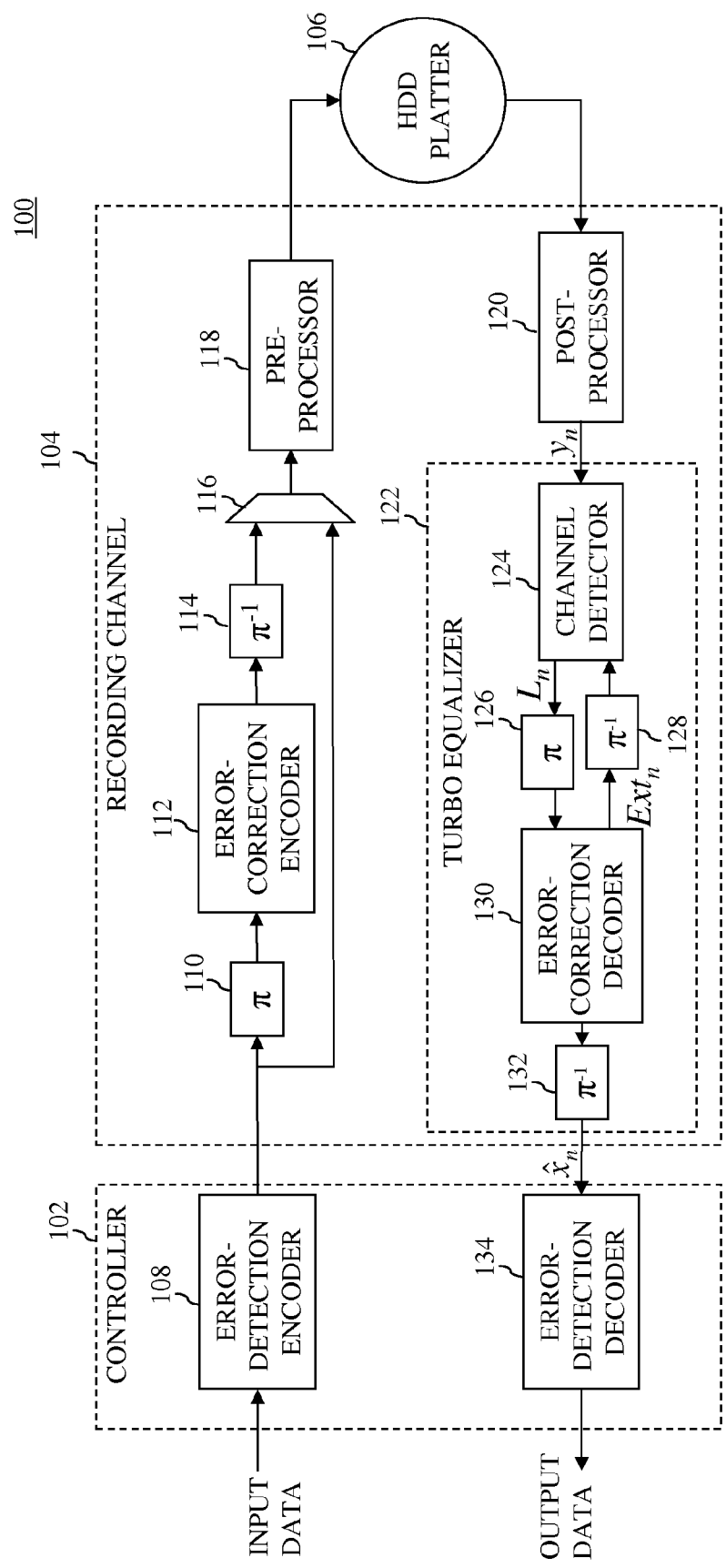
FIG. 1 shows a simplified block diagram of one implementation of a conventional hard-disk drive (HDD) system.

FIG. 1 shows a simplified block diagram of one implementation of a conventional hard-disk drive (HDD) system 100. HDD system 100 has controller 102 and recording channel 104, which are used to write incoming data to, and read outgoing data from, one or more HDD platters 106. In writing mode, controller 102 receives an input data stream from, for example, a user application, and encodes the input data stream using error-detection encoder 108. Error-detection encoder 108 may implement an error-detection encoding scheme such as cyclic-redundancy-check (CRC) encoding or any other suitable error-detection encoding scheme. Although not shown, controller 102 may also perform other suitable processing (not shown), such as run-length encoding, to prepare the input data stream for processing by recording channel 104.

Controller 102 provides the input data stream to recording channel 104, which prepares the input data stream for storage on HDD platter 106. In so doing, recording channel 104 may implement an interleaving scheme to reduce the effects that burst errors have on recovering the input data stream after it is stored on HDD platter 106. Recording channel 104 shows one exemplary interleaving scheme, in which the user data stream is interleaved to generate the error-correction-encoded codeword, but the data written to HDD platter 106 is not interleaved (i.e., interleaving is performed in the error-correction encoder/decoder domain). As shown, the input data stream is provided to interleaver ($\pi$) 110 and the lower input of multiplexer 116. Interleaver 110 interleaves the input data stream and provides the interleaved input data stream to error-correction encoder 112. Error-correction encoder 112 encodes the interleaved input data stream using a suitable error-correction encoding technique such as low-density parity-check (LDPC) encoding to generate an error-correction-encoded codeword. The parity bits of the error-correction-encoded codeword are then de-interleaved using de-interleaver ($\pi^{-1}$) 114, and the de-interleaved parity bits are provided to the upper input of multiplexer 116. Multiplexer 116 outputs the input (un-interleaved) user data stream, and in so doing, inserts the de-interleaved parity bits within the input user data stream. The input user data stream, with inserted de-interleaved parity bits, is then processed using pre-processor 118, which performs processing such as digital-to-analog conversion, pre-amplification, and possibly other suitable processing to prepare the input user data stream and the inserted parity bits for storage on HDD platter 106.

In reading mode, recording channel 104 retrieves analog data stored on HDD platter 106 and processes the analog data using post-processor 120. Post-processor 120 performs, for example, amplification, analog-to-digital conversion, finite-impulse-response (FIR) filtering, equalization, and possibly other processing suitable for retrieving data from HDD platter 106. Samples $y_n$ of the equalized, retrieved data stream are provided to turbo equalizer 122, which has at least one channel detector 124 and at least one error-correction decoder 130. Turbo equalizer 122 may be implemented in many different ways, and the details of turbo equalizer 122 are provided merely to illustrate the basic components of an exemplary turbo equalizer.

Channel detector 124 implements a suitable detection technique, such as Viterbi soft-output detection or maximum a posteriori (MAP) detection, to generate an initial soft-output value $L_n^{(0)}$ (e.g., a log-likelihood ratio (LLR)) corresponding to each bit n of the error-correction-encoded codeword. Note that, as used in this specification, the term "soft-output value" does not encompass equalized samples $y_n$ generated by post-processor 120. Further, the term "soft-output value" refers to a value comprising a hard-decision bit (i.e., the most-significant bit) and at least one confidence value bit (i.e., the least-significant bits). Depending on the implementation, soft-output values can be implemented in, for example, sign-magnitude format, two's complement format, or any other suitable format. The initial soft-output values $L_n^{(0)}$ are interleaved by interleaver 126, which performs interleaving analogous to that of interleaver 110. By interleaving the initial soft-output values $L_n^{(0)}$, any burst errors that are present upon retrieving the input data stream stored on HDD platter 106 may be spread out among the initial soft-output values $L_n^{(0)}$. The interleaved soft-output values $L_n^{(0)}$ are provided to error-correction decoder 130, which implements an error-correction decoding scheme, such as LDPC decoding, to recover the original error-correction-encoded codeword generated by error-correction encoder 112.

During each local iteration of error-correction decoder 130, error-correction decoder 130 generates a set of updated soft-output values $P_n$, each value $P_n$ corresponding to one bit n of the error-correction-encoded codeword. A local iteration is an iteration that is performed within error-correction decoder 130 itself, and does not involve channel detection or interleaving/de-interleaving. Upon generating a set of updated soft-output values $P_n$, a parity check is performed using the hard-decision bits $\hat{x}_n$ of the updated soft-output values $P_n$ to determine whether error-correction decoder 130 has converged on a valid codeword. A detailed discussion of a parity check in the context of LDPC decoding is provided in U.S. patent application Ser. No. 12/538,915 filed on Aug. 11, 2009, the teachings all of which are incorporated herein by reference in their entirety. The following discussion briefly summarizes these teachings.

In LDPC decoding, a parity check is performed by multiplying a vector $\hat{x}$, formed from the set of hard-decision bits $\hat{x}_n$, by the transpose $H^T$ of the LDPC parity-check matrix (i.e., H-matrix) used to generate the error-correction-encoded codeword. The resulting product is a vector, often referred to as the syndrome, and each bit of the syndrome corresponds to one row (i.e., check node) of the LDPC parity-check matrix. If one or more elements of the resulting syndrome is equal to one (i.e., $\hat{x}H^T \neq 0$), then error-correction decoder 130 has not converged on a valid codeword. Each element of the syndrome that has a value of one is considered an unsatisfied check node, and each element of the syndrome that has a value of zero is either (i) a satisfied check node or (ii) a missatisfied check node (i.e., a check node that falsely shows as satisfied).

If each element of the resulting syndrome is equal to zero (i.e., $\hat{x}H^T = 0$), then error-correction decoder 130 has converged on a valid codeword. In this case, the hard-decision bits $x_n$ are de-interleaved by de-interleaver 132, and the de-interleaved hard-decision bits $x_n$ are provided to error-detection decoder 134, which may perform, for example, a cyclic-redundancy check (CRC) to determine whether the valid codeword is the correct codeword (i.e., the codeword that was written to HDD platter 106). When CRC is part of the encoding scheme, typically a number r of CRC bits are appended to the user data by error-detection encoder 108 such that, upon decoding, vector $\hat{x}$ comprises (i) the user data transmitted by the transmitter and (ii) the r CRC bits. To perform the CRC, the user data may be divided by a keyword that is known a priori by the receiver and the remainder of the division process may be compared to the r CRC bits. If the remainder is equal to the r CRC bits, then error-correction decoder 130 has converged on the correct codeword. If the remainder is not equal to the r CRC bits, then error-correction decoder 130 has converged on a valid codeword that is not the correct codeword (i.e., the valid codeword has one or more missatisfied check nodes). In this case, further actions may be taken to recover the correct codeword, such as a re-read of the data.

If, after a predetermined number of local iterations, error-correction decoder 130 does not converge on a valid codeword, then the controller may (i) determine the number of unsatisfied check nodes and (ii) compare the number of unsatisfied check nodes to a specified threshold value (e.g., 16). The specified threshold value, which may be determined experimentally, may be used to predict whether error-correction decoder 130 has (i) converged on a trapping set or (ii) experienced an error in the communication channel that does not correspond to convergence on a trapping set. If the number of unsatisfied check nodes is greater than or equal to the specified threshold value, then it is likely that error-correction decoder 130 has experienced an error in the communication channel. Such errors may result from, for example, a flaw on HDD platter 106 or excessive noise in the communication channel. When such errors occur, further action, such as re-reading of the data, may be needed to recover the correct codeword. In some cases, error-correction decoder 130 might not be capable of recovering the correct codeword.

If, after the predetermined number of local iterations, the number of unsatisfied check nodes is less than the specified threshold value, then it is likely that error-correction decoder 130 has converged on a trapping set. A trapping set may be defined as a set of w bit nodes (i.e., columns of the LDPC parity-check matrix) that converges on a syndrome having a set of v odd-degree check nodes (i.e., unsatisfied check nodes) and an arbitrary number of even-degree check nodes (i.e., satisfied and/or missatisfied check nodes). Further, a trapping set may be caused by the passing of incorrect information between the check nodes and variable nodes. To break the trapping set, any of a number of different techniques may be performed. For example, additional global iterations of turbo equalizer 122, additional local iterations of error-correction decoder 130, or a combination of additional global and local iterations may be performed. A global iteration is an iteration of turbo equalizer 122 that includes channel detection, interleaving/de-interleaving, and error-correction decoding.

To perform an additional global iteration, error-correction decoder 130 generates an extrinsic soft-output value $Ext_n$ for each bit n of the error-correction-encoded codeword as shown in Equation (1) below:

$$Ext_n = P_n - L_n^{(0)}. \quad (1)$$

The extrinsic soft-output values $Ext_n$ are de-interleaved using de-interleaver 128 and provided to channel detector 124. Channel detector 124 performs another iteration of detection on the samples $y_n$ of the equalized, retrieved data stream, which are stored by turbo equalizer 122 (not shown) during the first global iteration. In so doing, channel detector 124 uses the extrinsic soft-output values $Ext_n$ to improve detection. For example, in Viterbi detection, the extrinsic soft-output values $Ext_n$ are used to improve the branch-metric calculation. Additionally, channel detector 124 uses the extrinsic soft-output values $Ext_n$ to calculate new channel soft-output values $L_n$ as shown in Equation (2) as follows:

$$L_n = Pdet_n - Ext_n, \quad (2)$$

where $Pdet_n$ is an updated soft-output value generated by channel detector 124 for each bit n of the error-correction-encoded codeword. The newly calculated channel soft-output values $L_n$ are interleaved using interleaver 126, and the interleaved channel soft-output values $L_n$ are decoded using error-correction decoder 130.

Often, performing additional local and/or global iterations alone is not sufficient to break a trapping set. Thus, to break a trapping set, additional techniques may be needed. The following description discusses several techniques for breaking trapping sets that involve adjusting (e.g., noise biasing) different values within a turbo equalizer. Adjusting such values may steer error-correction decoder 130 away from a trapping set such that error-correction decoder 130 can recover the correct error-correction codeword.

Adjusting Soft-output Values in Turbo Equalization to Break Trapping Sets

Figure 2:
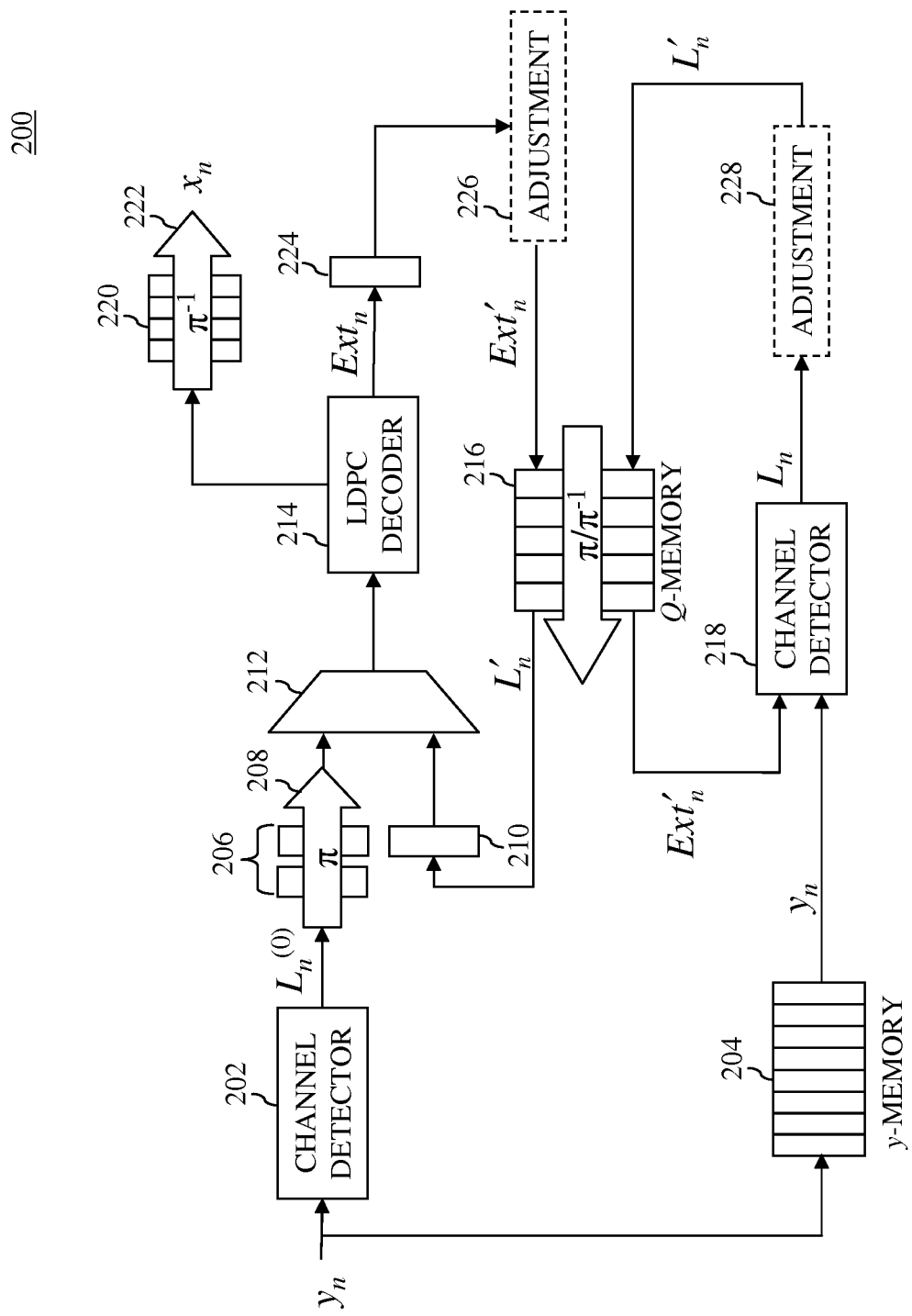
FIG. 2 shows a simplified block diagram of a turbo equalizer according to one embodiment of the present invention.

FIG. 2 shows a simplified block diagram of a turbo equalizer 200 according to one embodiment of the present invention. Turbo equalizer 200, which may be used, for example, in HDD systems such as HDD system 100 of FIG. 1, is capable of processing one or more LDPC-encoded codewords at a time. The number of LDPC-encoded codewords processed, and the number of global and/or local iterations that may be performed for each LDPC-encoded codeword may vary based on, for example, the memory resources (e.g., y-memory 204, Q-memory 216) available at the time that the codeword is processed. As discussed below, turbo equalizer 200 is capable of adjusting (i) the extrinsic soft-output values $Ext_n$ output from LDPC decoder 214 only, (ii) the channel soft-output values $L_n$ output from channel detector 218 only, or (iii) both the extrinsic soft-output values $Ext_n$ and the channel soft-output values $L_n$ to break trapping sets.

Turbo equalizer 200 receives equalized samples $y_n$ of an outgoing data stream that are (i) retrieved from an HDD platter such as HDD platter 106 of FIG. 1 and (ii) processed using, for example, a post-processor such as post-processor 120. During an initial global iteration, the equalized samples $y_n$ are (i) stored in y-memory 204 for potential use in subsequent global iterations and (ii) processed by channel detector 202, which performs detection analogous to channel detector 124 of FIG. 1 to generate an initial channel soft-output value $L_n^{(0)}$ for each bit n of the LDPC-encoded codeword. The initial channel soft-output values $L_n^{(0)}$ are interleaved using interleaver 208 and stored by ping-pong buffer 206. One of the buffers of ping-pong buffer 206 stores a set of channel soft-output values $L_n^{(0)}$ corresponding to the current LDPC-encoded codeword that is currently being interleaved, while the other buffer outputs an interleaved set of channel soft-output values $L_n^{(0)}$ corresponding to a previous LDPC-encoded codeword to the upper input of multiplexer 212. Multiplexer 212, which may also receive adjusted channel soft-output values $L'_n$, as described below, selects the upper input of initial channel soft-output values $L_n^{(0)}$ to output to LDPC decoder 214. Typically, the upper input of multiplexer 212 is selected only during the first global iteration for an LDPC-encoded codeword, and the upper input of multiplexer 212 is selected for the subsequent global iterations.

LDPC decoder 214 performs one or more local iterations to recover the original LDPC-encoded codeword as described above in relation to error-correction decoder 130 of FIG. 1. If LDPC decoder 214 converges on a valid codeword, then LDPC decoder 214 provides hard-decision bits $x_n$ to buffer 220. Once a full set of hard-decision bits $x_n$ is stored in buffer 220, the hard-decision bits $x_n$ are de-interleaved using de-interleaver 222 and output to, for example, a controller such as controller 102 of FIG. 1. If LDPC decoder 214 converges on a trapping set, rather than a valid codeword, then turbo equalizer 200 may perform a subsequent global iteration to break the trapping set. In so doing, extrinsic soft-output values $Ext_n$ are output from LDPC decoder 214 and stored in buffer 224. Some or all of the stored extrinsic soft-output values $Ext_n$ may be adjusted using adjustment block 226 as described in further detail below in relation to FIG. 3. The possibly-adjusted extrinsic soft-output values $Ext'_n$ are stored in Q-memory 216, which is implemented such that the possibly-adjusted extrinsic soft-output values $Ext'_n$ are de-interleaved as they are stored in Q-memory 216.

Q-memory 216 provides the de-interleaved and possibly-adjusted extrinsic soft-output values $Ext'_n$ to channel detector 218. Channel detector 218, which also receives the equalized samples $y_n$ from y-memory 204 performs detection analogous to channel detector 124 of FIG. 1 to generate a subsequent channel soft-output value $L_n$ for each bit n of the LDPC-encoded codeword. In so doing, channel detector 218 uses the extrinsic soft-output values $Ext'_n$ to (i) improve detection as described above and (ii) calculate new channel soft-output values $L_n$ as shown in Equation (2) above.

Some or all of the new channel soft-output values $L_n$ may be adjusted using adjustment block 228 as described in further detail below in relation to FIG. 3. The possibly-adjusted channel soft-output values $L'_n$ are stored in Q-memory 216, which is implemented such that the possibly-adjusted channel soft-output values $L'_n$ are interleaved as they are stored in Q-memory 216. The interleaved and possibly-adjusted channel soft-output values $L'_n$ are then stored in buffer 210, provided to the lower input of multiplexer 212, and output to LDPC decoder 214. If LDPC decoder 214 does not successfully decode the interleaved and possibly-adjusted channel soft-output values $L'_n$, then subsequent global iterations of turbo equalizer 200 and/or local iterations of LDPC decoder 214 may be performed.

Figure 3:
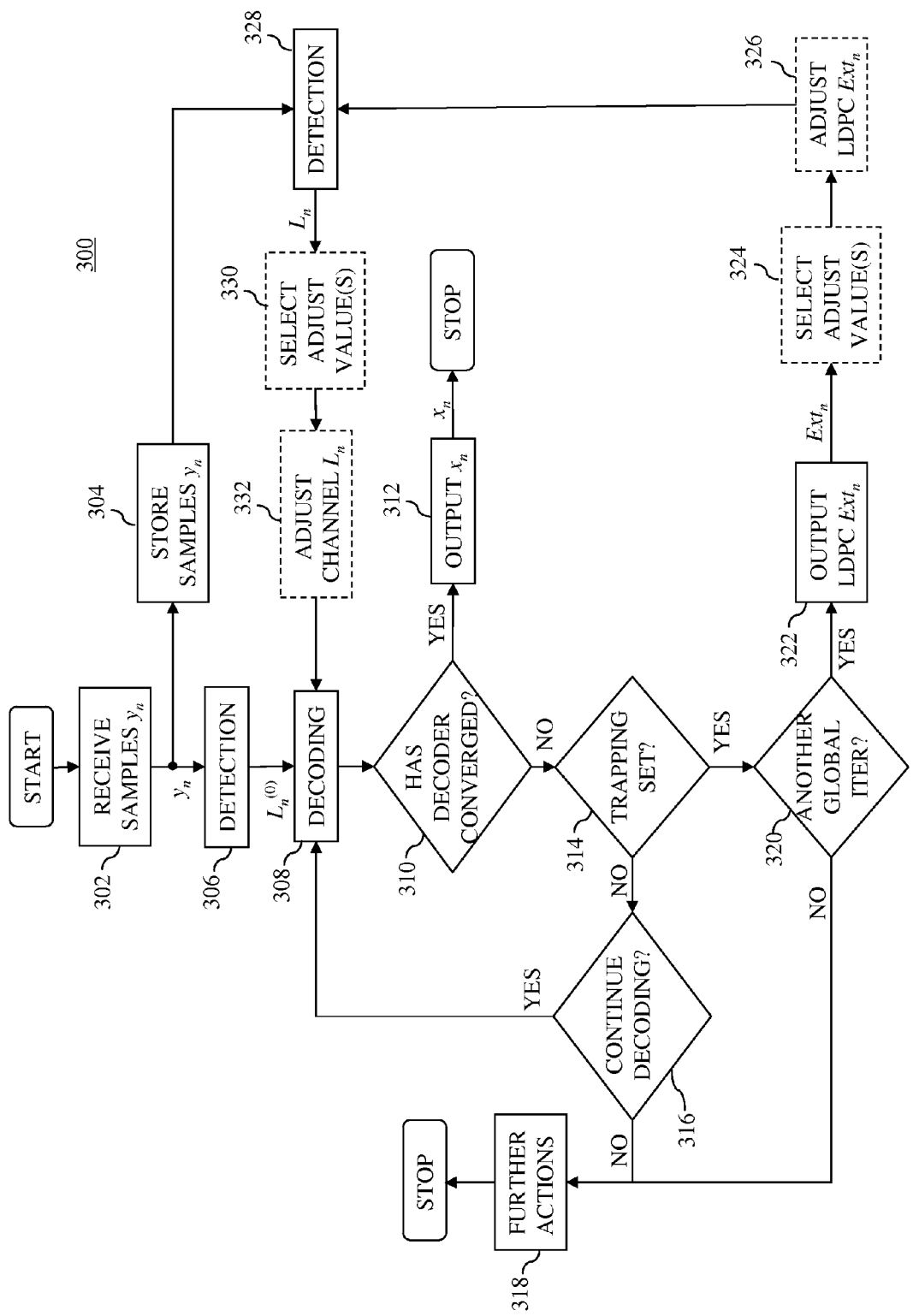
FIG. 3 a simplified flow diagram of processing performed by a turbo equalizer such as the turbo equalizer of FIG. 2 according to one embodiment of the present invention.

FIG. 3 shows a simplified flow diagram 300 of processing performed by a turbo equalizer such as turbo equalizer 200 of FIG. 2 according to one embodiment of the present invention. For simplicity, some steps such as interleaving, de-interleaving, storage in Q-memory, and storage in the various buffers are omitted. Upon startup, the equalized samples $y_n$ are received (step 302) by the turbo equalizer. The equalized samples $y_n$ are stored for potential use in further global iterations (step 304) of the turbo equalizer. Further, detection 306 is performed on the equalized samples $y_n$ to generate an initial set of channel soft-output values $L_n^{(0)}$ in a manner analogous to that described above in relation to channel detector 124 of FIG. 1.

The initial set of channel soft-output values $L_n^{(0)}$ are decoded 308 in a manner analogous to that described above in relation to error-correction decoder 130 of FIG. 1. A controller, such as controller 102, performs decision 310 to determine whether the decoder has converged on a valid codeword by, for example, performing a syndrome check. If the decoder has converged on a valid codeword, then the hard-decision bits $x_n$ are output (step 312) to the controller and turbo equalization is stopped. If the decoder has not converged on a valid codeword, then the controller determines whether a trapping set has been encountered (decision 314).

Determining whether the decoder has encountered a trapping may be performed using any suitable method. For example, the controller may compare the number of unsatisfied check nodes after a specified number of iterations of the decoder to a specified threshold value (e.g., 16). If the number of unsatisfied check nodes is greater than or equal to the specified threshold value, then it is likely that the decoder has experienced an error in the communication channel. If the number of unsatisfied check nodes is less than the specified threshold value, then it is likely that the decoder has converged on a trapping set. As another example, the decoder could track the number of unsatisfied check nodes over several iterations. If, over several iterations, the number of unsatisfied check nodes is relatively stable, then this could be indicative of a trapping set. This method may be implemented by tracking the variance of the number of unsatisfied check nodes over several iterations. If the variance is less than a specified threshold value, then the LDPC decoder may suppose that a trapping set has been encountered. This latter example may be advantageous when the decoder converges on a trapping set before the specified number of iterations. By identifying a trapping set before the specified number of iterations, the decoder can avoid performing unnecessary iterations.

As yet another example, the decoder could determine whether (i) the vector resulting from $\hat{x}H^T$ possesses a number ($b_{observed}$) of unsatisfied check nodes that is greater than zero and less than a pre-defined threshold $b_{max}$ (e.g., 16) and (ii) the particular configuration of unsatisfied check nodes has remained relatively stable (i.e., the number and locations of the unsatisfied check nodes have not changed) for several local iterations of the LDPC decoder (e.g., two or three iterations). As yet still another example, the decoder could determine whether (i) the vector resulting from $\hat{x}H^T$ possesses a number ($b_{observed}$) of unsatisfied check nodes greater than zero and less than a pre-defined threshold $b_{max}$ (e.g., 16), and (ii) the particular configuration of unsatisfied check nodes has remained relatively stable (i.e., unchanged) for several global iterations (e.g., two global iterations).

If the controller determines in decision 314 that the decoder has not converged on a trapping set, then the decoder may determine (decision 316) whether or not to perform additional local (i.e., decoder) iterations. For example, if the number of unsatisfied check nodes is relatively large (e.g., greater than 16), then, as described above, the decoder might have experienced an error in the communication channel. In such a case, it might not be possible for the decoder to recover the correct codeword, and the controller might initiate further actions (step 318) such as request a retransmission of the data. As another example, the controller may determine whether the decoder has performed the specified number of iterations. If the decoder has performed the specified number of iterations, then additional global iterations may be performed. If, on the other hand, the decoder has not performed the specified number of iterations, then the controller may determine in decision 316 to continue decoding (i.e., perform an additional local iteration) and processing returns to step 308.

If the controller determines in decision 314 that the decoder has converged on a trapping set, then the controller determines in decision 320 whether or not to perform an additional global iteration. This determination may be made, for example, based on whether or not a specified number of global iterations have been performed. If the controller determines not to perform an additional global iteration, then further actions 318 may be needed to break the trapping set, such as request a retransmission of the data. If the controller determines to perform an additional global iteration, then extrinsic soft-output values $Ext_n$ are output by the decoder (step 322).

To increase the likelihood of breaking the trapping set, the extrinsic soft-output values $Ext_n$ may be adjusted (step 326) by applying an adjustment value to some or all of the extrinsic soft-output values $Ext_n$. Adjustment may be performed, for example, by an adjustment block such as adjustment block 226 of FIG. 2. Further, adjustment may be performed by, for example, applying an adjustment value such as (i) a scaling factor α (e.g., −1, −0.75, . . . , +0.75, +1) to the extrinsic soft-output values $Ext_n$ as shown in Equation (3) or (ii) an offset value β to the extrinsic soft-output values $Ext_n$ as shown in Equation (4) below:

$$Ext'_n = \alpha Ext_n \qquad (3)$$

$$Ext'_n = \mathrm{sign}(Ext_n) \times (|Ext_n| + \beta), \qquad (4)$$

where $Ext'_n$ is the adjusted extrinsic soft-output value and $\mathrm{sign}(Ext_n)$ is the sign of the extrinsic soft-output value $Ext_n$. Adjustment may also be performed by applying both a scaling factor and an offset value to the extrinsic soft-output values $Ext_n$. When adjustment is first applied to the extrinsic soft-output values $Ext_n$, preferably during the first iteration after reaching a trapping set, an initial scaling factor and/or offset value is selected (step 324). In the case of scaling, the scaling factor $\alpha$ may be chosen such that the multiplication may be approximated using binary right and/or left shift operations. For example, shifting a binary value of 0110 (i.e., +6 in decimal format) one position to the right results in 0011 (i.e., +3 in decimal format), which is the equivalent of multiplying by a scaling factor of 0.5. If the decoder does not converge on a correct codeword after applying the initial scaling factor and/or offset value, then different scaling factors and/or offset values may be selected during subsequent global iterations.

As another example, some or all of the extrinsic soft-output values $Ext_n$ may be saturated to decrease the confidence values of the extrinsic soft-output values $Ext_n$. For example, suppose that the extrinsic soft-output values $Ext_n$ range from $-15, \ldots, +15$ in sign-magnitude format. The extrinsic soft-output values $Ext_n$ could be saturated to saturation levels other than $-15, \ldots, +15$. For example, they could be saturated to $-2, \ldots, +2$, such that an extrinsic soft-output value $Ext_n$ greater than +2 is mapped to +2, and an extrinsic soft-output value $Ext_n$ less than $-2$ is mapped to $-2$. If the decoder does not converge on a correct codeword after applying the initial saturation levels, then different saturation levels may be selected during subsequent global iterations. An analogous saturation operation may be performed for extrinsic soft-output values $Ext_n$ that are represented in two's complement format. As yet another alternative, some or all of the extrinsic soft-output values $Ext_n$ could be adjusted using a combination of two or more of the scaling, offsetting, and saturation techniques.

Adjusting of the extrinsic soft-output values $Ext_n$ may be either unconditional or conditional. Unconditional adjusting may be performed by adjusting the extrinsic soft-output values $Ext_n$ without any independent determination as to which extrinsic soft-output value $Ext_n$ should or should not be adjusted. For example, according some unconditional adjusting methods, every extrinsic soft-output value $Ext_n$ may be scaled, offset, and/or saturated. According to other unconditional adjusting methods, adjusting may be performed by adding random noise to the extrinsic soft-output values $Ext_n$. Random noise may be generated using any suitable method. For example, random noise may be generated using a random noise generator. As another example, random noise may be generated by taking the difference of (i) the input, which comprises data and noise, of an FIR filter such as an FIR filter in a post-processor 120 of FIG. 1 and (ii) the FIR output, which if filtered adequately comprises substantially only data. As one of ordinary skill in the art would recognize, random noise may have a value of zero in some locations. Thus, when random noise is added to all of the extrinsic soft-output values $Ext_n$, it is possible that some of the extrinsic soft-output values $Ext_n$ will not be changed.

Conditional adjusting may be performed to independently select some, but not all, of the extrinsic soft-output values $Ext_n$ for scaling, offsetting, and/or saturating. For example, according to a first conditional adjusting method, the controller identifies the locations of the unsatisfied check nodes of the last local decoder iteration. This may be performed by identifying the locations of the elements in the syndrome that have a value of one. Then, the extrinsic soft-output values $Ext_n$ corresponding to bit nodes (i.e., columns of the LDPC parity-check matrix) of the LDPC-encoded codeword that are connected to the identified unsatisfied check nodes may be adjusted.

According to other conditional adjusting methods, the controller determines whether or not to adjust each extrinsic soft-output value $Ext_n$ based on a comparison of the signs of two corresponding soft-output values as illustrated in Table I below. If the sign bits disagree, then the corresponding extrinsic soft-output value $Ext_n$ is adjusted. If the sign bits agree, then the corresponding extrinsic soft-output values $Ext_n$ is not adjusted. Table I shows some of the soft-output values that could be compared.

TABLE I

|   | First Soft-Output Value | Second Soft-Output Value |
|---|---|---|
| 1 | $\text{sign}(Pdet_n)$ | $\text{sign}(P_n)$ |
| 2 | $\text{sign}(Pdet_n)$ | $\text{sign}(L_n)$ |
| 3 | $\text{sign}(Pdet_n)$ | $\text{sign}(Ext_n)$ |
| 4 | $\text{sign}(L_n)$ | $\text{sign}(Ext_n)$ |
| 5 | $\text{sign}(L_n)$ | $\text{sign}(P_n)$ |
| 6 | $\text{sign}(Ext_n)$ | $\text{sign}(P_n)$ |

As shown in the first row, the sign of the updated soft-output value $Pdet_n$ generated by the channel detector corresponding to the $n^{th}$ bit of the error-correction-encoded codeword could be compared to the updated soft-output value $P_n$ generated by the error-correction decoder corresponding to the $n^{th}$ bit. As shown in the second row, the sign of the updated soft-output value $Pdet_n$ generated by the channel detector corresponding to the $n^{th}$ bit could be compared to the updated channel soft-output value $L_n$ generated by the channel detector corresponding to the $n^{th}$ bit. As shown in the third row, the sign of the updated soft-output value $Pdet_n$ generated by the channel detector corresponding to the $n^{th}$ bit could be compared to the updated extrinsic soft-output value $Ext_n$ generated by the error-correction decoder corresponding to the $n^{th}$ bit. As shown in the fourth row, the sign of the updated channel soft-output value $L_n$ generated by the channel detector corresponding to the $n^{th}$ bit could be compared to the updated extrinsic soft-output value $Ext_n$ generated by the error-correction decoder corresponding to the $n^{th}$ bit. As shown in the fifth row, the sign of the updated channel soft-output value $L_n$ generated by the channel detector corresponding to the $n^{th}$ bit could be compared to the updated soft-output value $P_n$ generated by the error-correction decoder corresponding to the $n^{th}$ bit. As shown in the sixth row, the updated extrinsic soft-output value $Ext_n$ generated by the error-correction decoder corresponding to the $n^{th}$ bit could be compared to the updated soft-output value $P_n$ generated by the error-correction decoder corresponding to the $n^{th}$ bit.

After the extrinsic soft-output values $Ext_n$ are output and possibly adjusted, channel detection (step 328) is performed on the equalized samples $y_n$ stored in step 304 to generate subsequent channel soft-output values $L_n$. In so doing, the possibly-adjusted extrinsic soft-output values $Ext'_n$ are used to improve the channel detection capabilities as described above. To increase the likelihood of breaking the trapping set, some or all of the subsequent channel soft-output values $L_n$ output by the channel detector may be adjusted (e.g., noise biased) (step 332) by applying an adjustment value to some or all of the subsequent channel soft-output values $L_n$. Adjustment may be performed, for example, by an adjustment block such as adjustment block 228 of FIG. 2. Further, adjustment may be performed, for example, by applying an adjustment value such as (i) a scaling factor $\alpha$ (e.g., $-1, -0.75, \ldots, +0.75, +1$) to the subsequent channel soft-output values $L_n$ as shown in Equation (5) or (ii) an offset value $\beta$ to the subsequent channel soft-output values $L_n$ as shown in Equation (6) below:

$$L'_n = \alpha L_n \quad (5)$$

$$L'_n = \text{sign}(L_n) \times (|L_n| + \beta), \quad (6)$$

where $L'_n$ is the subsequent channel soft-output value $L_n$ and $\text{sign}(L_n)$ is the sign of the subsequent channel soft-output value $L_n$. Adjustment may also be performed by applying both a scaling factor and an offset value to the channel soft-output value $L_n$. When adjustment is first applied to the subsequent channel soft-output values $L_n$, preferably during the first iteration after reaching a trapping set, an initial scaling factor and/or offset value is selected (step 330). If the decoder does not converge on a correct codeword after applying the initial scaling factor and/or offset value, then different scaling factors and/or offset values may be selected during subsequent global iterations.

As another example, some or all of the channel soft-output values $L_n$ may be saturated in a manner similar to that described above in relation to the extrinsic soft-output values $\text{Ext}_n$ to decrease the confidence values of the channel soft-output values $L_n$. As yet another alternative, some or all of the extrinsic soft-output values $\text{Ext}_n$ could be adjusted using a combination of two or more of the scaling, offsetting, and saturation techniques.

Adjustment of the subsequent channel soft-output values $L_n$ may be performed conditionally or unconditionally in a manner similar to that described above in relation to step 326. For example, the subsequent channel soft-output values $L_n$ may be unconditionally adjusted by applying a scaling factor, offset value, and/or saturation to all of the subsequent channel soft-output values $L_n$ or random noise may be added to the subsequent channel soft-output values $L_n$. As another example, each subsequent channel soft-output value $L_n$ may be conditionally adjusted based on, for example, (i) the locations of the unsatisfied check nodes of the last local decoder iteration or (ii) a comparison of the signs of two corresponding soft-output values as illustrated in Table I.

The possibly-adjusted subsequent channel soft-output values $L'_n$ are then decoded (step 308). If the controller determines that the decoder converged on a trapping set again (step 314), then a subsequent global iteration may be performed where the controller selects new adjustment values (steps 324 and/or 330) for adjusting the extrinsic soft-output values $\text{Ext}_n$ and/or the subsequent channel soft-output values $L_n$ (steps 326 and/or 332). If the controller determines that the decoder has not converged on a trapping set, then step 316 is performed as described above.

Adjusting Equalized Samples in Turbo Equalization to Break Trapping Sets

Figure 4:
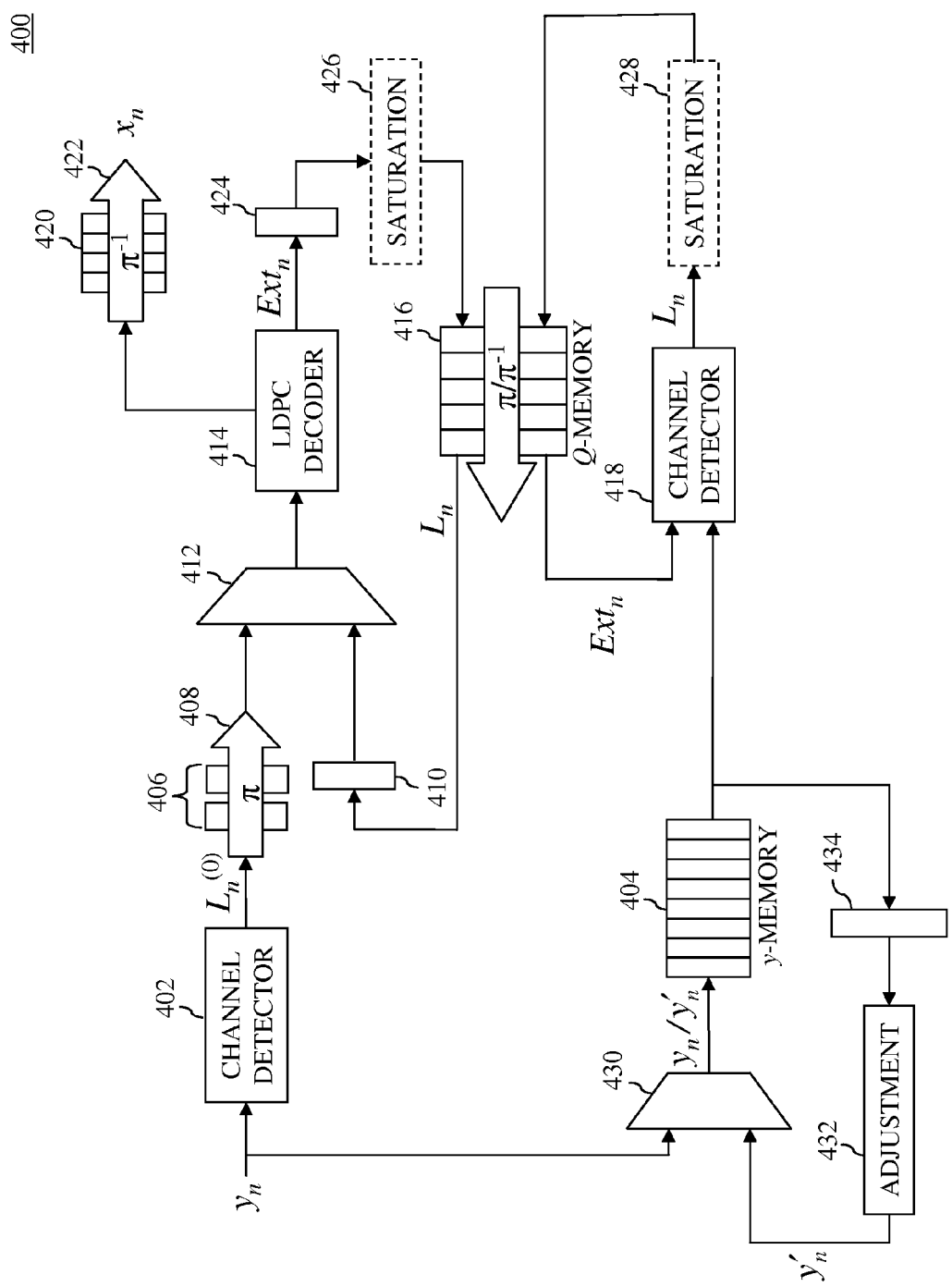
FIG. 4 shows a simplified block diagram of a turbo equalizer according to another embodiment of the present invention.

FIG. 4 shows a simplified block diagram of a turbo equalizer 400 according to another embodiment of the present invention. Similar to turbo equalizer 200 of FIG. 2, turbo equalizer 400 may be used, for example, in an HDD system such as HDD system 100 of FIG. 1, and is capable of processing one or more error-correction-encoded codewords at a time. The number of error-correction-encoded codewords processed, and the number of global and/or local iterations that may be performed for each error-correction-encoded codeword may vary based on, for example, the memory resources (e.g., y-memory 404, Q-memory 416) available at the time that the codeword is processed. Further, as described below, turbo equalizer 400 is capable of adjusting (e.g., biasing) equalized, retrieved samples $y_n$ to break trapping sets.

Turbo equalizer 400 receives equalized samples $y_n$ of an outgoing data stream that are (i) retrieved from an HDD platter such as HDD platter 106 of FIG. 1 and (ii) processed using, for example, a post-processor such as post-processor 120. During the initial global iteration, the equalized samples $y_n$ are provided to (i) the upper input of multiplexer 430 and (ii) channel detector 402. Multiplexer 430, which may also receive adjusted samples $y'_n$ via its lower input, provides its upper input to y-memory 404, which stores the equalized samples $y_n$ for potential use in subsequent global iterations.

Channel detector 402, ping-pong buffer 406, interleaver 408, multiplexer 412, and LDPC decoder 414 perform operations analogous to the equivalent processing of turbo decoder 200 of FIG. 2. If LDPC decoder 414 converges on a valid codeword, then LDPC decoder 414 provides hard-decision bits $x_n$ to buffer 420 and de-interleaver 422, which perform operations analogous to buffer 220 and de-interleaver 222 of FIG. 2. If LDPC decoder 414 converges on a trapping set, rather than a valid codeword, then turbo equalizer 400 may perform a subsequent global iteration using y-sample adjustments (e.g., noise biasing) to break the trapping set. In so doing, extrinsic soft-values $\text{Ext}_n$ are output from LDPC decoder 414 and stored in buffer 424. After storing the extrinsic soft-output values $\text{Ext}_n$, saturation block 426 may saturate the extrinsic soft-output values $\text{Ext}_n$ such that they are maintained within a specified range. Saturation may be performed in a manner analogous to that described above in relation to step 326 of FIG. 3. The possibly-saturated extrinsic soft-output values $\text{Ext}_n$ are then stored in Q-memory 416, which performs operations analogous to Q-memory 216 of FIG. 2 (i.e., storing, interleaving, de-interleaving). Note that, according to alternative embodiments of the present invention, scaling and/or offsetting may be used in addition to, or in lieu of, saturation block 426.

Q-memory 416 provides de-interleaved and possibly-saturated extrinsic soft-values $\text{Ext}_n$ to channel detector 418. Channel detector 418 performs operations analogous to channel detector 218 of FIG. 2 to generate subsequent channel soft-output values $L_n$; however, rather than performing channel detection on the equalized, retrieved samples $y_n$, channel detector 418 performs detection on adjusted samples $y'_n$. In particular, the equalized, retrieved samples $y_n$ stored in y-memory 404 are provided to delay buffer 434. Some or all of the equalized, retrieved samples $y_n$ are adjusted using adjustment block 432, which performs conditional adjusting (e.g., noise biasing) as described in further detail below in relation to FIG. 5. The possibly-adjusted samples $y'_n$ are provided to the lower input of multiplexer 430 and are subsequently stored in y-memory 404 before being processed by channel detector 418.

After channel detection, the subsequent channel soft-output values $L_n$ may be saturated using saturation block 428, which operates in a manner analogous to saturation block 426, and the possibly-saturated subsequent channel soft-output values $L_n$ are interleaved and stored in Q-memory 416. Note that, according to alternative embodiments of the present invention, scaling and/or offsetting may be used in addition to, or in lieu of, saturation block 428. The interleaved channel soft-output values $L_n$ are then stored in buffer 410, provided to the lower input of multiplexer 412, and output to LDPC decoder 414. If LDPC decoder 414 does not successfully decode the interleaved channel soft-output values $L_n$, then subsequent global iterations of turbo equalizer 400 and/or local iterations of LDPC decoder 414 may be performed.

Figure 5:
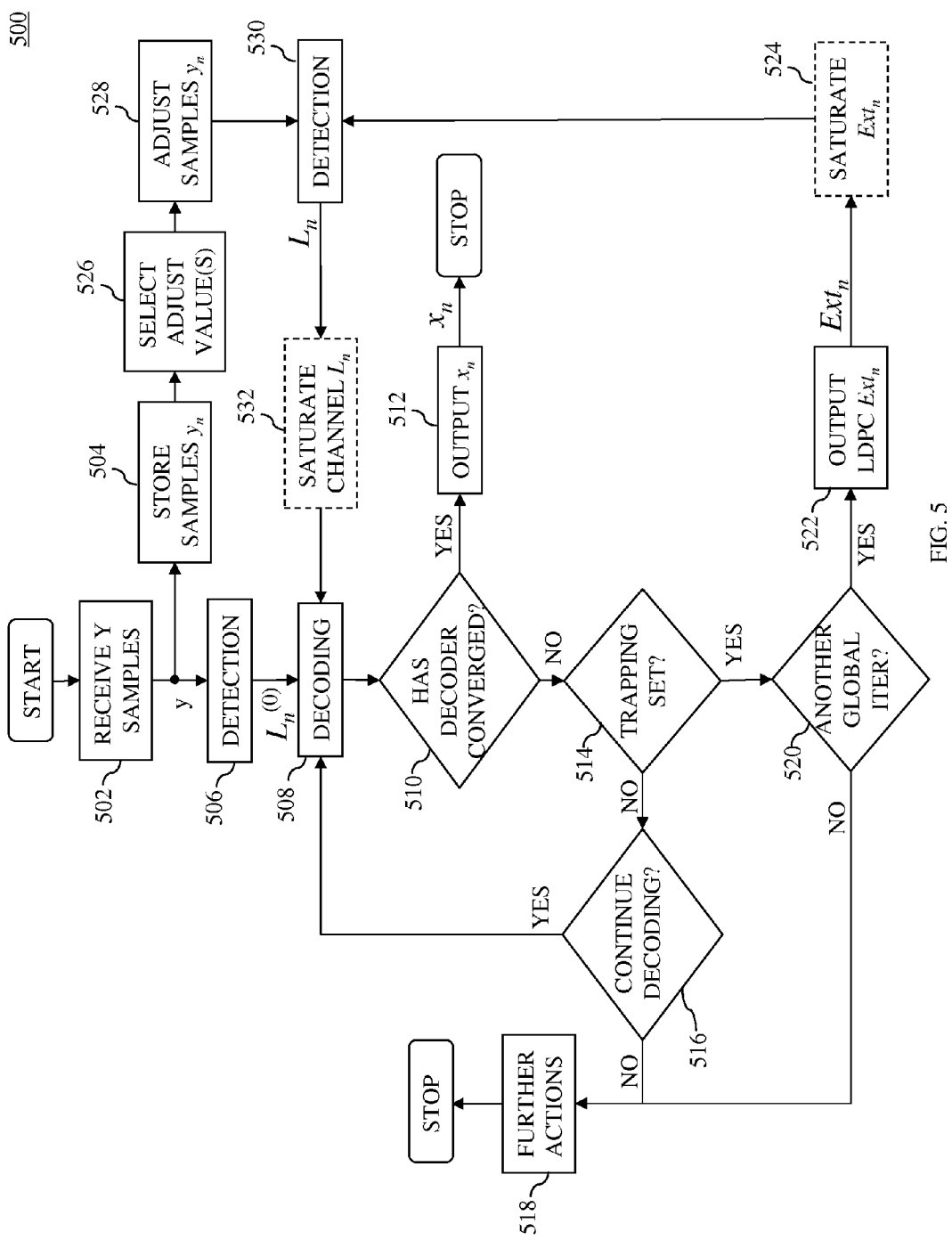
FIG. 5 shows a simplified flow diagram of processing performed by a turbo equalizer such as the turbo equalizer of FIG. 4 according to one embodiment of the present invention.

FIG. 5 shows a simplified flow diagram 500 of processing performed by a turbo equalizer such as turbo equalizer 400 of FIG. 4 according to one embodiment of the present invention. For simplicity, some steps such as interleaving, de-interleaving, storage in Q-memory, and storage in various buffers have been omitted. Upon startup, the equalized, retrieved input data samples $y_n$ are received (e.g., step 502) by the turbo equalizer. The equalized, retrieved input data samples $y_n$ are stored (step 504) for potential use in further global iterations of the turbo equalizer. During the first global iteration, steps 506-518 are performed in a manner analogous to that of the equivalent steps of flow diagram 300 of FIG. 3. If, during the first global iteration, the decoder converges on a trapping set (decision 514), and, if the controller determines to perform another global iteration (decision 520), then one or more combinations of subsequent global iterations of the turbo equalizer and/or local iterations of the error-correction decoder may be performed.

In performing a subsequent global iteration, extrinsic soft-output values $Ext_n$ are output from the error-correction decoder. The extrinsic soft-output values $Ext_n$ are possibly saturated (step 524) in a manner analogous to that described above in relation to step 324 of FIG. 3, and the possibly-saturated extrinsic soft-output values $Ext_n$ are provided to the channel detector for use in improving the detection capabilities of the channel detector as described above.

Before performing channel detection (step 530), the equalized samples $y_n$ stored in step 504 are conditionally adjusted (step 526) to increase the likelihood of breaking the trapping set. Conditional adjusting of equalized samples $y_n$ may be performed in a manner similar to that described above in relation to step 324 of FIG. 3. For example, one or more of the equalized samples $y_n$ may be selected based on, for example, (i) the locations of the unsatisfied check nodes of the last local decoder iteration or (ii) a comparison of the signs of two corresponding soft-output values as illustrated in Table I. The selected equalized samples $y_n$ may then be adjusted by, for example, an adjustment block such as adjustment block 432 of FIG. 4. Adjustment may be performed by applying a scaling factor as shown in Equation (7) or an offset value as shown in Equation (8) below:

$$y'_n = \alpha y_n \quad (7)$$

$$y'_n = \text{sign}(y_n) \times (|y_n| + \beta), \quad (8)$$

where $y'_n$ is the adjusted equalized sample and $\text{sign}(y_n)$ is the sign of the equalized samples $y_n$. Adjustment may also be performed by applying both a scaling factor and an offset value to the equalized samples $y_n$. Alternatively, or in addition, the equalized samples $y_n$ may be saturated in a manner similar to that described in relation to step 324 of FIG. 3.

After channel detection (step 530), subsequent channel soft-output values $L_n$ are output from the channel detector and possibly saturated (step 532) in a manner similar to that described above in relation to step 324 of FIG. 3. The possibly-saturated subsequent channel soft-output values $L_n$ are then decoded (step 508). If the controller determines that the decoder converged on a trapping set again (step 514), then a subsequent global iteration may be performed where the controller selects a new scaling factor and/or offset value (step 526) for adjusting the equalized samples $y_n$ in step 528. If the controller determines that the decoder has not converged on a trapping set, then step 516 is performed.

Conclusion

Although the present invention was described relative to its use in HDD systems, the present invention is not so limited. The present invention may be used in other storage systems, or in applications other than storage devices such as communication receivers.

The present invention may be used in turbo equalizers other than the exemplary turbo equalizers provided in this application. One of ordinary skill in the art would recognize that there are many different configurations of turbo equalizers, and that the present invention may be applied to turbo equalizers having configurations different from those provided in this application. Such other turbo equalizers may employ channel detection other than Viterbi detection and/or other error-correction decoding other than LDPC decoding. Such other turbo equalizers may employ one channel detector or more than one channel detector. Also, such other turbo equalizers may employ one error-correction decoder as shown in FIG. 2 or more than one error-correction decoder.

Further, the present invention is not limited to adjusting extrinsic soft-output values $Ext_n$, channel soft-output values $L_n$, and equalized samples $y_n$. For example, the various embodiments of the present invention may adjust (i) updated soft-output values $P_n$ generated by the error-correction decoder in addition to, or in lieu of, the extrinsic soft-output values and/or (ii) updated soft-output values $Pdet_n$ generated by the channel detector in addition to, or in lieu of, the channel soft-output values $L_n$.

It will be further understood that various changes in the details, materials, and arrangements of the parts which have been described and illustrated in order to explain the nature of this invention may be made by those skilled in the art without departing from the scope of the invention as expressed in the following claims. For example, in FIG. 2, rather than adjusting extrinsic soft-output values $Ext_n$ before storage in Q-memory 216, the extrinsic soft-output values $Ext_n$ may be adjusted after storage in Q-memory 216. Similarly, channel soft-output values $L_n$ may be adjusted after storage in Q-memory 216.

Further embodiments of the present invention may be envisioned which employ a combination of two or more of y-sample adjusting, extrinsic soft-output value $Ext_n$ adjusting, and channel soft-output $L_n$ adjusting to break trapping sets.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An apparatus for recovering an error-correction encoded codeword from a set of input samples, the apparatus comprising:
at least one channel detector adapted to perform channel detection on the set of input samples to generate a first set of soft-input values;
an error-correction decoder adapted to (i) perform error-correction decoding on the first set of soft-input values to attempt to recover the error-correction-encoded codeword and (ii) generate a first set of soft-output values, each soft-output value corresponding to a bit of the error-correction-encoded codeword; and
an adjuster adapted to adjust, if the error-correction decoder converges on a trapping set, one or more of the input samples to generate an adjusted set of input samples, wherein the apparatus is adapted to determine whether one or more specified conditions exist to select the one or more input samples for adjustment, wherein:
the at least one channel detector is further adapted to perform channel detection to generate a second set of soft-output values for subsequent error-correction decoding, wherein:
the second set of soft-output values is generated based on (i) the adjusted set of input samples and (ii) the first set of soft-output values; and
each soft-output value in the second set corresponds to a bit of the error-correction-encoded codeword.

2. The apparatus of claim 1, wherein, if the error-correction decoder converges on a trapping set, then the apparatus:
identifies (i) locations of unsatisfied check nodes in the error-correction decoder and (ii) locations of bit nodes that are connected to the unsatisfied check nodes; and
selects the one or more input samples for adjustment such that each selected input sample corresponds to an identified bit node location.

3. The apparatus of claim 1, wherein, for each input sample, the apparatus:
compares (i) a sign bit of a first comparison value that corresponds to the input sample and (ii) a sign bit of a second comparison value that corresponds to the input sample; and
selects the input sample for adjustment if the comparison indicates that the sign bits of the first and the second comparison values disagree.

4. The apparatus of claim 3, wherein:
the first comparison value is one of an extrinsic soft-output value, an updated soft-output value generated by the at least one channel detector, and a channel soft-output value corresponding to the soft-output value; and
the second comparison value is one of an updated soft-output value generated by the error-correction decoder, a channel soft-output value, and an extrinsic soft-output value corresponding to the soft-output value, wherein the first comparison value is different from the second comparison value.

5. The apparatus of claim 4, wherein:
the first comparison value is an extrinsic soft-output value corresponding to the soft-output value; and
the second comparison value is a channel soft-output value corresponding to the soft-output value.

6. The apparatus of claim 1, wherein the adjuster adjusts the one or more input samples by applying a scaling factor to the one or more input samples.

7. The apparatus of claim 1, wherein the adjuster adjusts the one or more input samples by applying an offset value to the one or more input samples.

8. The apparatus of claim 1, wherein the adjuster adjusts the one or more input samples by applying one or more saturation levels to the one or more input samples.

9. The apparatus of claim 1, wherein the apparatus selects fewer than all of the input samples for adjustment.

10. The apparatus of claim 1, wherein:
the adjuster adjusts the one or more input samples by applying one or more of (i) a scaling factor, (ii) an offset value, and (iii) one or more saturation levels to the one or more input samples; and
the apparatus dynamically adjusts one or more of (i) the scaling factor, (ii) the offset value, and (iii) the one or more saturation levels.

11. The apparatus of claim 1, wherein the error-correction decoder is a low-density parity-check decoder.

12. The apparatus of claim 1, wherein the apparatus comprises one or more other adjusters adapted to adjust at least one set of (i) the first set of soft-output values before the channel detection and (ii) the second set of soft-output values before the subsequent error-correction decoding.

13. The apparatus of claim 12, wherein the one or more other adjusters adjust the at least one set by applying one or more saturation levels to the at least one set.

14. A method for recovering an error-correction error-correction-encoded codeword from a set of input samples, the method comprising:
(a) performing channel detection on the set of input samples to generate a first set of soft-input values;
(b) performing error-correction decoding on the first set of soft-input values to attempt to recover the error-correction-encoded codeword;
(c) generating a first set of soft-output values, each soft-output value corresponding to a bit of the error-correction-encoded codeword;
(d) determining, if the error-correction decoding converges on a trapping set, whether one or more specified conditions exist to select one or more of the input samples for adjustment, and adjusting the one or more input samples to generate an adjusted set of input samples; and (e) performing channel detection to generate a second set of soft-output values for subsequent error-correction decoding, wherein:
the second set of soft-output values is generated based on (i) the adjusted set of input samples and (ii) the first set of soft-output values; and
each soft-output value in the second set corresponds to a bit of the error-correction-encoded codeword.

15. The method of claim 14, wherein, if the error-correction decoding converges on a trapping set, then step (c) comprises:
(c1) identifying locations of unsatisfied check nodes encountered during the error-correction decoding;
(c2) identifying locations of bit nodes that are connected to the unsatisfied check nodes; and
(c3) selecting the one or more input samples for adjustment such that each selected input sample corresponds to an identified bit node location.

16. The method of claim 14, wherein, for each input sample, step (c) comprises:
(c1) comparing (i) a sign bit of a first comparison value that corresponds to the input sample and (ii) a sign bit of a second comparison value that corresponds to the input sample; and
(c2) selecting the input sample for adjustment if the comparison indicates that the sign bits of the first and the second comparison values disagree.

17. The method of claim 16, wherein:
the first comparison value is one of an extrinsic soft-output value, an updated soft-output value generated by the channel detector, and a channel soft-output value corresponding to the soft-output value; and
the second comparison value is one of an updated soft-output value generated by the error-correction decoder, a channel soft-output value, and an extrinsic soft-output value corresponding to the soft-output value, wherein the first comparison value is different from the second comparison value.

18. The method of claim 17, wherein:
the first comparison value is an extrinsic soft-output value corresponding to the soft-output value; and
the second comparison value is a channel soft-output value corresponding to the soft-output value.

19. The method of claim 14, step (c) comprises:
(c1) adjusting the one or more input samples by applying one or more of (i) a scaling factor, (ii) an offset value, and (iii) one or more saturation levels to the one or more input samples; and
(c2) dynamically adjusting one or more of (i) the scaling factor, (ii) the offset value, and (iii) the one or more saturation levels.

20. The method of claim 14, further comprising:
(e) adjusting at least one set of (i) the first set of soft-output values before the channel detection and (ii) the second set of soft-output values before the subsequent error-correction decoding.

21. An apparatus for recovering an error-correction-encoded codeword from a set of input samples, the apparatus comprising:
an error-correction decoder adapted to (i) perform error-correction decoding to attempt to recover the error-correction-encoded codeword and (ii) generate a first set of soft-output values, each soft-output value corresponding to a bit of the error-correction-encoded codeword;
an adjuster adapted to adjust, if the error-correction decoder converges on a trapping set, one or more of the input samples to generate an adjusted set of input samples, wherein the apparatus is adapted to determine whether one or more specified conditions exist to select the one or more input samples for adjustment; and
a channel detector adapted to perform channel detection to generate a second set of soft-output values for subsequent error-correction decoding, wherein:
the second set of soft-output values is generated based on (i) the adjusted set of input samples and (ii) the first set of soft-output values; and
each soft-output value in the second set corresponds to a bit of the error-correction-encoded codeword, wherein:
for each input sample, the apparatus:
compares (i) a sign bit of a first comparison value that corresponds to the input sample and (ii) a sign bit of a second comparison value that corresponds to the input sample; and
selects the input sample for adjustment if the comparison indicates that the sign bits of the first and the second comparison values disagree, wherein:
the first comparison value is one of an extrinsic soft-output value, an updated soft-output value generated by the channel detector, and a channel soft-output value corresponding to the soft-output value; and
the second comparison value is one of an updated soft-output value generated by the error-correction decoder, a channel soft-output value, and an extrinsic soft-output value corresponding to the soft-output value, wherein the first comparison value is different from the second comparison value.

22. The apparatus of claim 21, wherein:
the first comparison value is an extrinsic soft-output value corresponding to the soft-output value; and
the second comparison value is a channel soft-output value corresponding to the soft-output value.

23. A method for recovering an error-correction error-correction-encoded codeword from a set of input samples, the method comprising:
(a) performing error-correction decoding to attempt to recover the error-correction-encoded codeword;
(b) generating a first set of soft-output values, each soft-output value corresponding to a bit of the error-correction-encoded codeword;
(c) determining, if the error-correction decoding converges on a trapping set, whether one or more specified conditions exist to select one or more of the input samples for adjustment, and adjusting the one or more input samples to generate an adjusted set of input samples; and
(d) performing channel detection to generate a second set of soft-output values for subsequent error-correction decoding, wherein:
the second set of soft-output values is generated based on (i) the adjusted set of input samples and (ii) the first set of soft-output values; and
each soft-output value in the second set corresponds to a bit of the error-correction-encoded codeword, wherein:
for each input sample, step (c) comprises:
(c1) comparing (i) a sign bit of a first comparison value that corresponds to the input sample and (ii) a sign bit of a second comparison value that corresponds to the input sample; and (c2) selecting the input sample for adjustment if the comparison indicates that the sign bits of the first and the second comparison values disagree, wherein:

the first comparison value is one of an extrinsic soft-output value, an updated soft-output value generated by the channel detector, and a channel soft-output value corresponding to the soft-output value; and the second comparison value is one of an updated soft-output value generated by the error-correction decoder, a channel soft-output value, and an extrinsic soft-output value corresponding to the soft-output value, wherein the first comparison value is different from the second comparison value.

24. The method of claim 23, wherein:

the first comparison value is an extrinsic soft-output value corresponding to the soft-output value; and the second comparison value is a channel soft-output value corresponding to the soft-output value.

\* \* \* \* \*

UNITED STATES PATENT AND TRADEMARK OFFICE
CERTIFICATE OF CORRECTION

PATENT NO.         : 8,683,299 B2
APPLICATION NO.    : 12/540035
DATED              : March 25, 2014
INVENTOR(S)        : Kiran Gunnam et al.

It is certified that error appears in the above-identified patent and that said Letters Patent is hereby corrected as shown below:

On the Title Page

Include the following cited references:

--Karkooti, M., et al., "Semi-Parallel Reconfigurable Architectures For Real-Time LDPC Decoding," Information International Conference On Technology: Coding and Computing Proceedings, April 2004, Vol. 1, PP. 579-585--

--Tzu-chieh, K., "Flexible Decoder Architectures For Irregular QC-LDPC Code," 51st Midwest Symposium On Circuits and Systems, Aug. 10-13, 2008, pp. 229-232--

Signed and Sealed this
Second Day of September, 2014

Michelle K. Lee
*Deputy Director of the United States Patent and Trademark Office*